US012210037B2

(12) United States Patent
Lou

(10) Patent No.: US 12,210,037 B2
(45) Date of Patent: Jan. 28, 2025

(54) PROBE ARRAY AND PROBE STRUCTURE

(71) Applicant: VUETTE PTE. LTD., Singapore (SG)

(72) Inventor: Choon Leong Lou, Hsinchu (TW)

(73) Assignee: VUETTE PTE. LTD., Singapore (SG)

( * ) Notice: Subject to any disclaimer, the term of this patent is extended or adjusted under 35 U.S.C. 154(b) by 59 days.

(21) Appl. No.: 18/151,152

(22) Filed: Jan. 6, 2023

(65) Prior Publication Data

US 2024/0053381 A1 Feb. 15, 2024

(30) Foreign Application Priority Data

Aug. 15, 2022 (TW) .................................. 111130670

(51) Int. Cl.
*G01R 1/067* (2006.01)
*G01R 31/28* (2006.01)

(52) U.S. Cl.
CPC ..... *G01R 1/06733* (2013.01); *G01R 31/2891* (2013.01)

(58) Field of Classification Search
CPC ............ G01R 1/06733; G01R 31/2891; G01R 1/06772; G01R 1/07314; G01R 1/073; G01R 1/07307
See application file for complete search history.

(56) References Cited

U.S. PATENT DOCUMENTS

| 7,180,318 B1* | 2/2007 | Mahoney ........... G01R 1/07357 |
| | | 324/762.03 |
| 2018/0011126 A1* | 1/2018 | Acconcia ........... G01R 1/06733 |
| 2019/0377005 A1 | 12/2019 | Crippa et al. |
| 2020/0166541 A1 | 5/2020 | Bohm et al. |
| 2023/0021227 A1 | 1/2023 | Crippa et al. |

FOREIGN PATENT DOCUMENTS

| JP | 2009-31087 A | 2/2009 |
| TW | 202124972 A | 7/2021 |
| WO | WO2023126239 A1 | 7/2023 |
| WO | WO2024087906 A1 | 5/2024 |

OTHER PUBLICATIONS

Office Action (with brief translation) dated Mar. 30, 2023 corresponding to TW Application No. 111130670.

* cited by examiner

*Primary Examiner* — G. M. A Hyder
(74) *Attorney, Agent, or Firm* — MUNCY, GEISSLER, OLDS & LOWE, P.C.

(57) ABSTRACT

The present disclosure provides a probe array and a probe structure. The probe array includes a first probe structure and a second probe structure. The first probe structure includes a first body having a first end and a second end. The second probe structure includes a second body having a first end and a second end. The first end of the first body and the first end of the second body have a same sectional area on a first section. The second end of the first body and the second end of the second body have a same sectional area on a second section. The first body and the second body have different shapes.

14 Claims, 11 Drawing Sheets ary and probe
PROBE ARRAY AND PROBE STRUCTURE

TECHNICAL FIELD

The present disclosure relates to a probe array and probe structures and, more particularly, to a probe array with probe structures capable of detecting different signal types.

DISCUSSION OF THE BACKGROUND

According to prior art, a wide variety of integrated circuit (IC) chips have to undergo electrical tests during their manufacturing processes to fulfill specific testing purposes, resulting in development of different probe structures including, for example, a thick probe structure for use in high-current testing, and a thin probe structure for use in high-frequency testing. However, very few existing probe structures can simultaneously fulfill multiple testing purposes.

If probe structures of different dimensions are arranged in a same probe array to fulfill different testing purposes, it will be impossible to have equal dimensions of the openings of the guide plates configured to support the probe structures in the probe array. This would result in the following issues: (1) difficulty in keeping contact forces in equilibrium while the probe structures in the probe array are in contact with an object under test, thereby leading to unstable testing; (2) difficulty in adjusting distances between the probe structures in the probe array; and (3) difficulty in controlling temperatures during testing while the probe structures in the probe array are in contact with an object under test.

The above description of the prior art merely serves to reveal background technology but is not intended to acknowledge that the above description of the prior art discloses the subject matters of the disclosure, is intended to constitute the prior art of the disclosure, or is intended to be any part of the disclosure.

SUMMARY

An embodiment of the disclosure provides a probe array comprising a first probe structure and a second probe structure. The first probe structure comprises a first body. The first body has a first end and a second end. The second probe structure comprises a second body. The second body has a first end and a second end. The first end of the first body and the first end of the second body have the same cross-sectional area on a first cross section. The second end of the first body and the second end of the second body have the same cross-sectional area on a second cross section. The first body is different from the second body in shape.

In some embodiments, the first end of the first body and the first end of the second body are located on the same side.

In some embodiments, the first cross section and the second cross section are parallel.

In some embodiments, the first end of the first body and the first end of the second body are of the same shape.

In some embodiments, the second end of the first body and the second end of the second body are of the same shape.

In some embodiments, at least a first hollowed-out portion, at least a first concave portion, or a combination of the at least a first hollowed-out portion and the at least a first concave portion are formed on the first body and extend from the first end of the first probe structure to the second end of the first probe structure.

In some embodiments, at least a second hollowed-out portion, at least a second concave portion, or a combination of the at least a second hollowed-out portion and the at least a second concave portion are formed on the second body and extend from the first end of the second probe structure to the second end of the second probe structure.

In some embodiments, the probe array further comprises a guide plate. The guide plate has a first hole and a second hole. The first hole receives the first end of the first probe structure. The second hole receives the first end of the second probe structure.

In some embodiments, the first hole and the second hole are of the same size and shape.

Another embodiment of the disclosure provides a probe structure comprising a body. The body has a first end and a second end. At least a hollowed-out portion, at least a concave portion, or a combination of the at least a hollowed-out portion and the at least a concave portion are formed on the body and extend from the first end to the second end. The cross-sectional area of the first end on a first cross section is the same as the cross-sectional area of the second end on a second cross section. The first cross section and the second cross section are parallel.

In some embodiments, the first end and the second end are of the same shape.

In some embodiments, the at least a concave portion or a combination of the at least a hollowed-out portion and the at least a concave portion are formed on the body, and the at least a concave portion has a curve or a trapezoid.

In some embodiments, the body is of the same thickness from the first end to the second end.

The above description extensively explains the technical features and advantages of the disclosure to render the detailed description below comprehensible. The other advantages and technical features which define the claims of the disclosure are described below. Persons skilled in the art understand that objectives identical to the ones of the disclosure can be easily achieved by changing or designing the other structures or processes in accordance with concepts and specific embodiments disclosed hereunder. Persons skilled in the art also understand that the aforesaid equivalent construction cannot depart from the spirit and scope of the appended claims of the disclosure.

BRIEF DESCRIPTION OF THE DRAWINGS

Persons skilled in the art can gain insight into the disclosure by referring to the embodiments, claims and drawings of the disclosure. In the drawings, like components are denoted by like reference numerals.

DETAILED DESCRIPTION

Figure 1A:
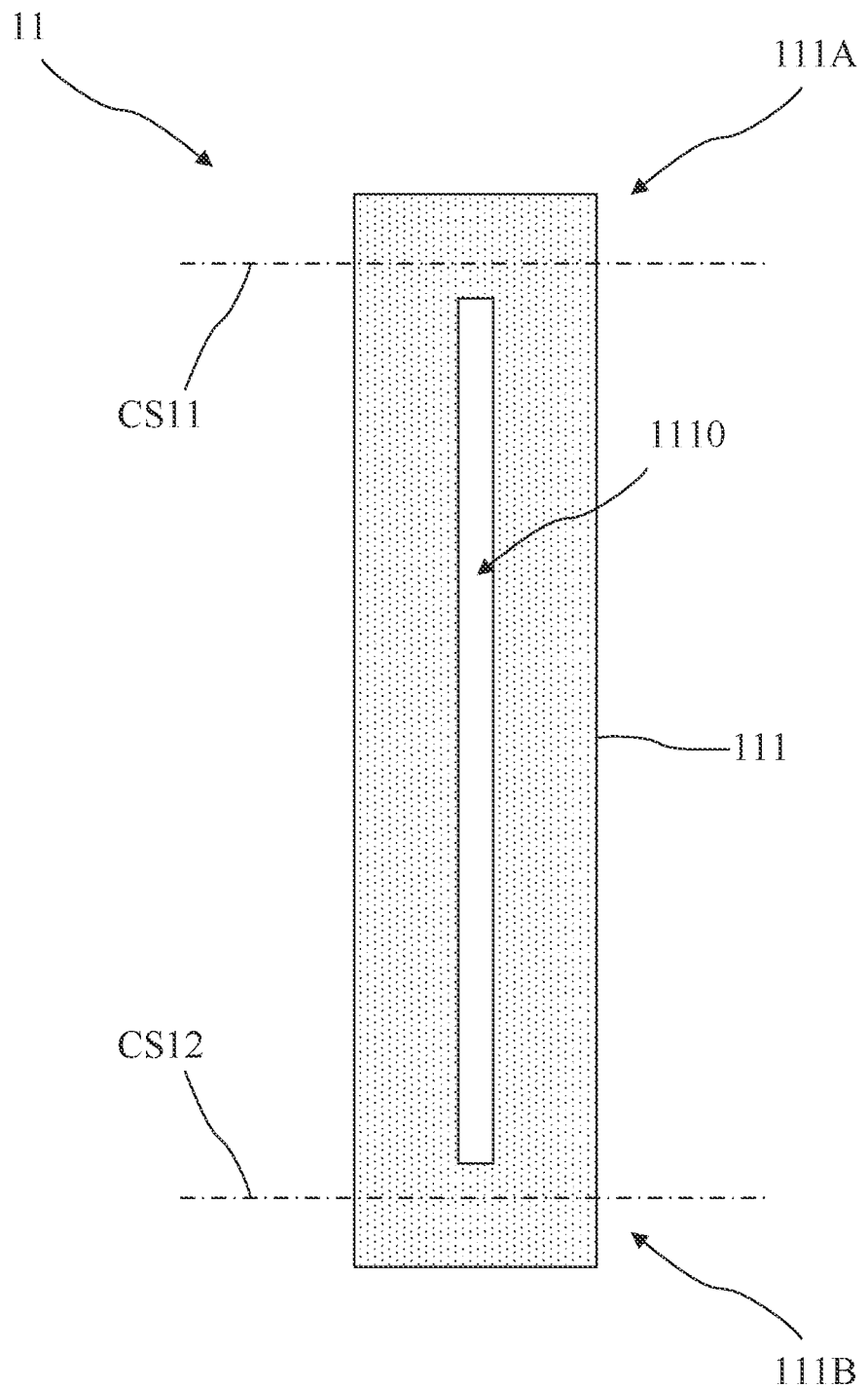
FIG. 1A is a front view of a probe structure according to some embodiments of the disclosure.

The following description of the present disclosure is accompanied by figures that are incorporated into and constitute a part of the specification to illustrate embodiments of the present disclosure, but the present disclosure is not limited to the embodiments. In addition, the following embodiments can be appropriately integrated to complete another embodiment.

Terms such as "one embodiment," "embodiment," "exemplary embodiment," "other embodiments," "another embodiment," etc. indicate that the embodiments described in this disclosure may include specific features, structures or characteristics. However, not every embodiment has to include the specific features, structures or characteristics. Furthermore, repeated use of the term "in an embodiment" does not necessarily refer to a same embodiment, although it may.

In order to make the present disclosure fully understandable, the following description provides detailed steps and structures. Obviously, specific details known to those skilled in the art are not limited by implementation of the present disclosure. In addition, known structures and steps will not be described in detail, so as not to unnecessarily limit the present disclosure. Preferred embodiments of the present disclosure are described in detail as follows. However, in addition to detailed descriptions, the present disclosure can also be widely implemented in other embodiments. The scope of this disclosure is not limited to the content of the detailed description, but is defined by the appended claims.

It should be realized that the following disclosure provides many different embodiments, or examples, for implementing different features of the provided subject matter. Specific examples of components and arrangements are described below to simplify the present disclosure. These are, of course, merely examples and are not intended to be limiting. For example, sizes of elements are not limited to the disclosed range or value, but may depend on process conditions and/or desired properties of a device. In addition, formation of a first feature over or on a second feature in the description that follows may include embodiments in which the first and second features are formed in direct contact, and may also include embodiments in which additional features may be formed between the first and second features, such that the first and second features may not be in direct contact. For sake of brevity and clarity, dimensions of the various features may be arbitrarily increased or reduced. In the figures, some layers or features may be omitted for simplicity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A probe array in an embodiment of the disclosure comprises a first probe structure and a second probe structure. A first end of the first probe structure and a first end of the second probe structure have the same cross-sectional area on a first cross section. A second end of the first probe structure and a second end of the second probe structure have the same cross-sectional area on a second cross section. The body of the first probe structure is different from the body of the second probe structure in shape, for example, (1) at least a hollowed-out portion, (2) at least a concave portion, or (3) a combination of at least a hollowed-out portion and at least a concave portion.

Therefore, different probe structures of the disclosure have the same end portion, such that the different probe structures can be disposed in the same probe array to meet different testing needs by simultaneously performing high-current testing (for example, with a probe structure having a large cross-sectional area) and high-frequency testing (for example, with a probe structure having a small cross-sectional area). Furthermore, the probe structures are of the same outer dimension, and thus the contact forces are uniformly distributed while the probe structures in the probe array are in contact with an object under test to facilitate installing or changing the probes, render the adjustment of the intervals between the probe structures easy (for example, given small, equal intervals), and render the control of temperature in the course of testing easy.

Referring to FIG. 1A, there is shown a front view of a probe structure 11 according to some embodiments of the disclosure. The probe structure 11 comprises a body 111. The body 111 has a first end 111A and a second end 111B. At least a hollowed-out portion 1110 is formed on the body 111 and extends from the first end 111A to the second end 111B.

In some embodiments, the first end 111A has a cross-sectional area on a first cross section CS11, and the second end 111B has a cross-sectional area on a second cross section CS12. The cross-sectional area of the first end 111A on the first cross section CS11 is the same as the cross-sectional area of the second end 111B on the second cross section CS12. The first cross section CS11 is parallel to the second cross section CS12.

Figure 1B:
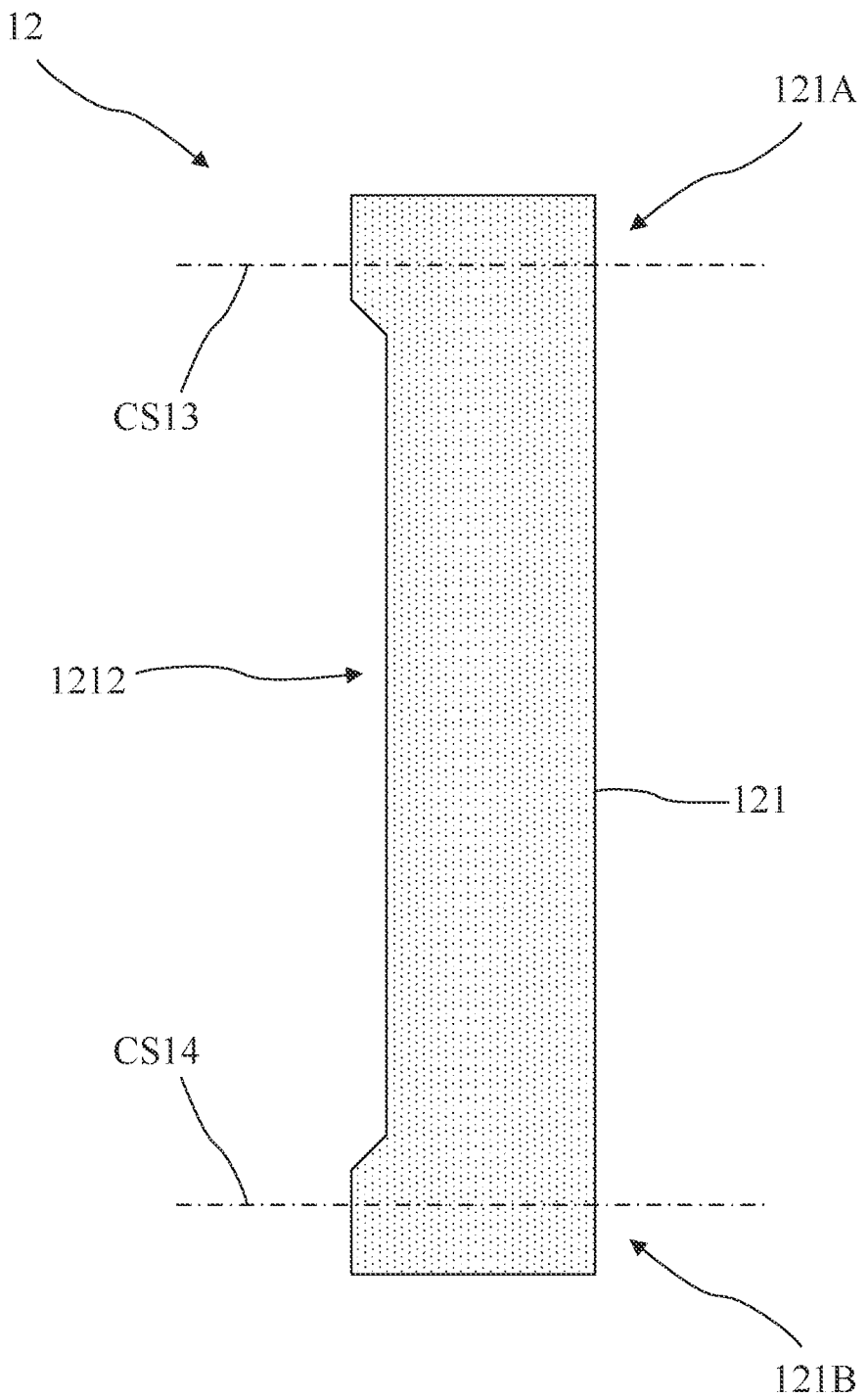
FIG. 1B is a front view of a probe structure according to some embodiments of the disclosure.

Referring to FIG. 1B, there is shown a front view of a probe structure 12 according to some embodiments of the disclosure. The probe structure 12 comprises a body 121. The body 121 has a first end 121A and a second end 121B. At least a concave portion 1212 is formed on the body 121 and extends from the first end 121A to the second end 121B.

In some embodiments, the first end 121A has a cross-sectional area on a first cross section CS13, and the second end 121B has a cross-sectional area on a second cross section CS14. The cross-sectional area of the first end 121A on the first cross section CS13 is the same as the cross-sectional area of the second end 121B on the second cross section CS14. The first cross section CS13 is parallel to the second cross section CS14.

Figure 1C:
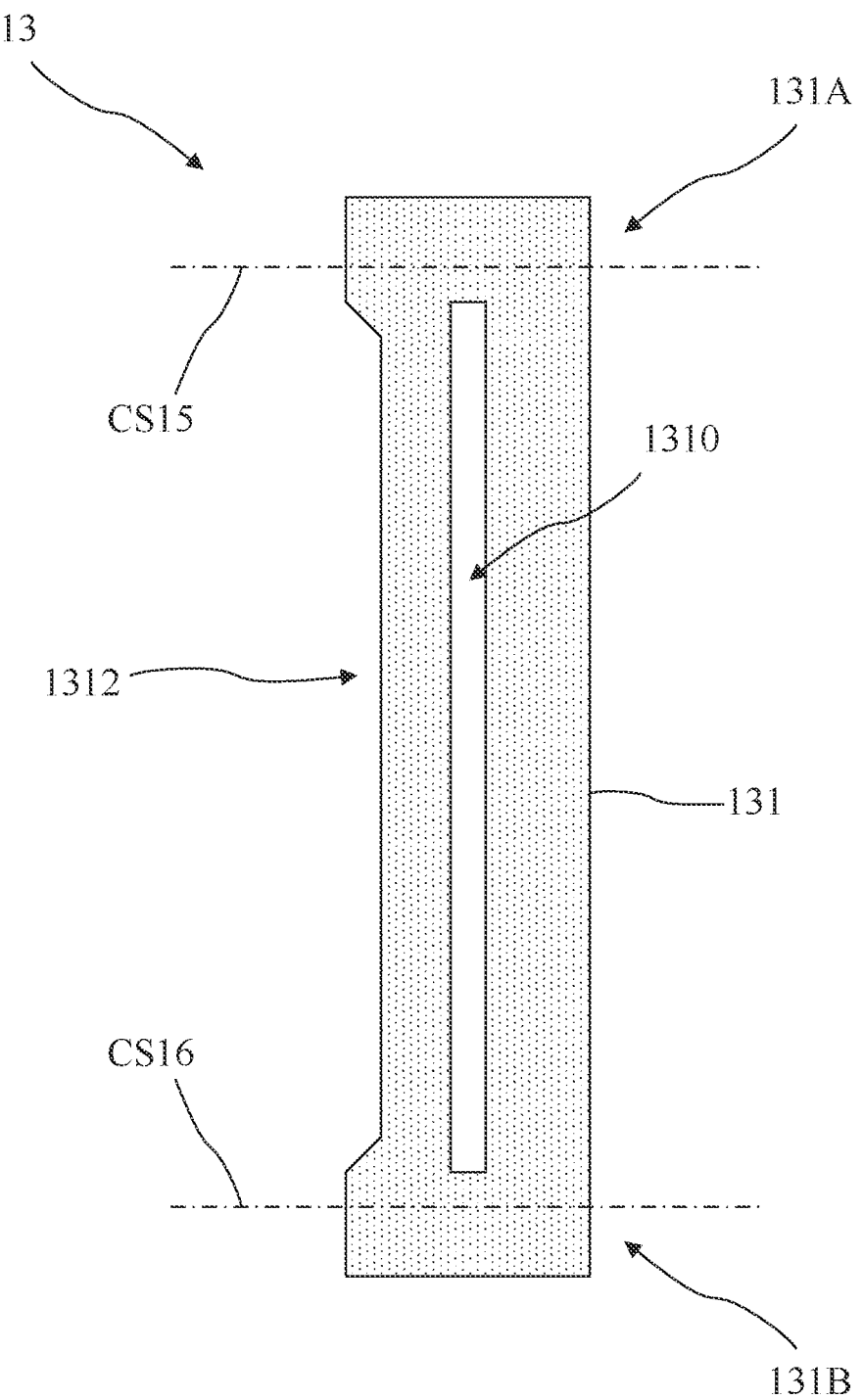
FIG. 1C is a front view of a probe structure according to some embodiments of the disclosure.

Referring to FIG. 1C, there is shown a front view of a probe structure 13 according to some embodiments of the disclosure. The probe structure 13 comprises a body 131. The body 131 has a first end 131A and a second end 131B. At least a hollowed-out portion 1310 and at least a concave portion 1312 are formed on the body 131 and extend from the first end 131A to the second end 131B.

In some embodiments, the first end 131A has a cross-sectional area on a first cross section CS15, and the second end 131B has a cross-sectional area on a second cross section CS16. The cross-sectional area of the first end 131A on the first cross section CS15 is the same as the cross-sectional area of the second end 131B on the second cross section CS16. The first cross section CS15 is parallel to the second cross section CS16.

Figure 2A:
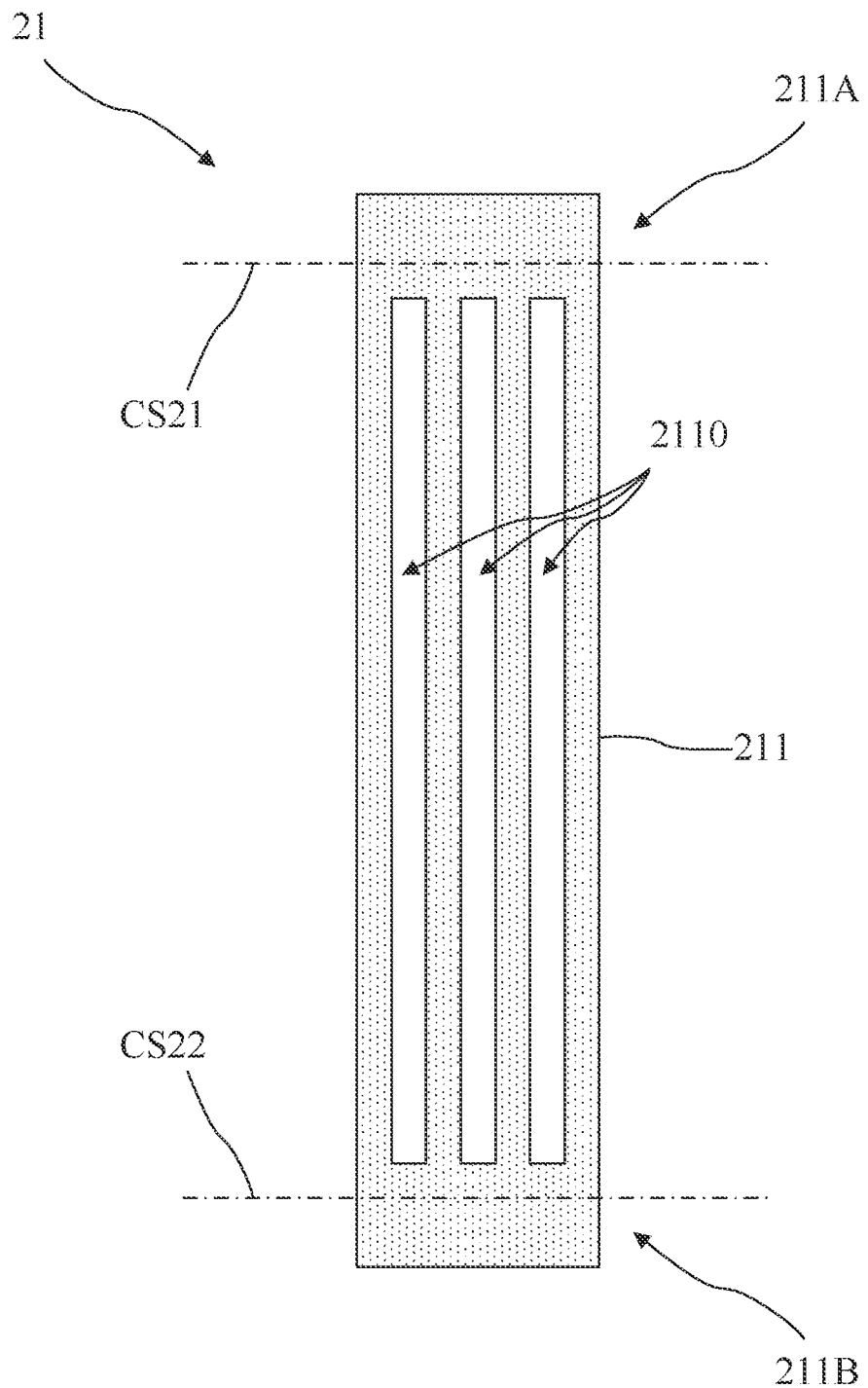
FIG. 2A is a front view of a probe structure according to some embodiments of the disclosure.

Referring to FIG. 2A, there is shown a front view of a probe structure 21 according to some embodiments of the disclosure. The probe structure 21 comprises a body 211. The body 211 has a first end 211A and a second end 211B. A plurality of hollowed-out portions 2110 are formed on the body 211 and each extend from the first end 211A to the second end 211B. In some embodiments, the plurality of hollowed-out portions 2110 are of the same shape (for example, slender shape).

In some embodiments, the first end 211A has a cross-sectional area on a first cross section CS21, and the second end 211B has a cross-sectional area on a second cross section CS22. The cross-sectional area of the first end 211A on the first cross section CS21 is the same as the cross-sectional area of the second end 211B on the second cross section CS22. The first cross section CS21 is parallel to the second cross section CS22. In some embodiments, the first end 211A and the second end 211B are of the same shape.

Figure 2B:
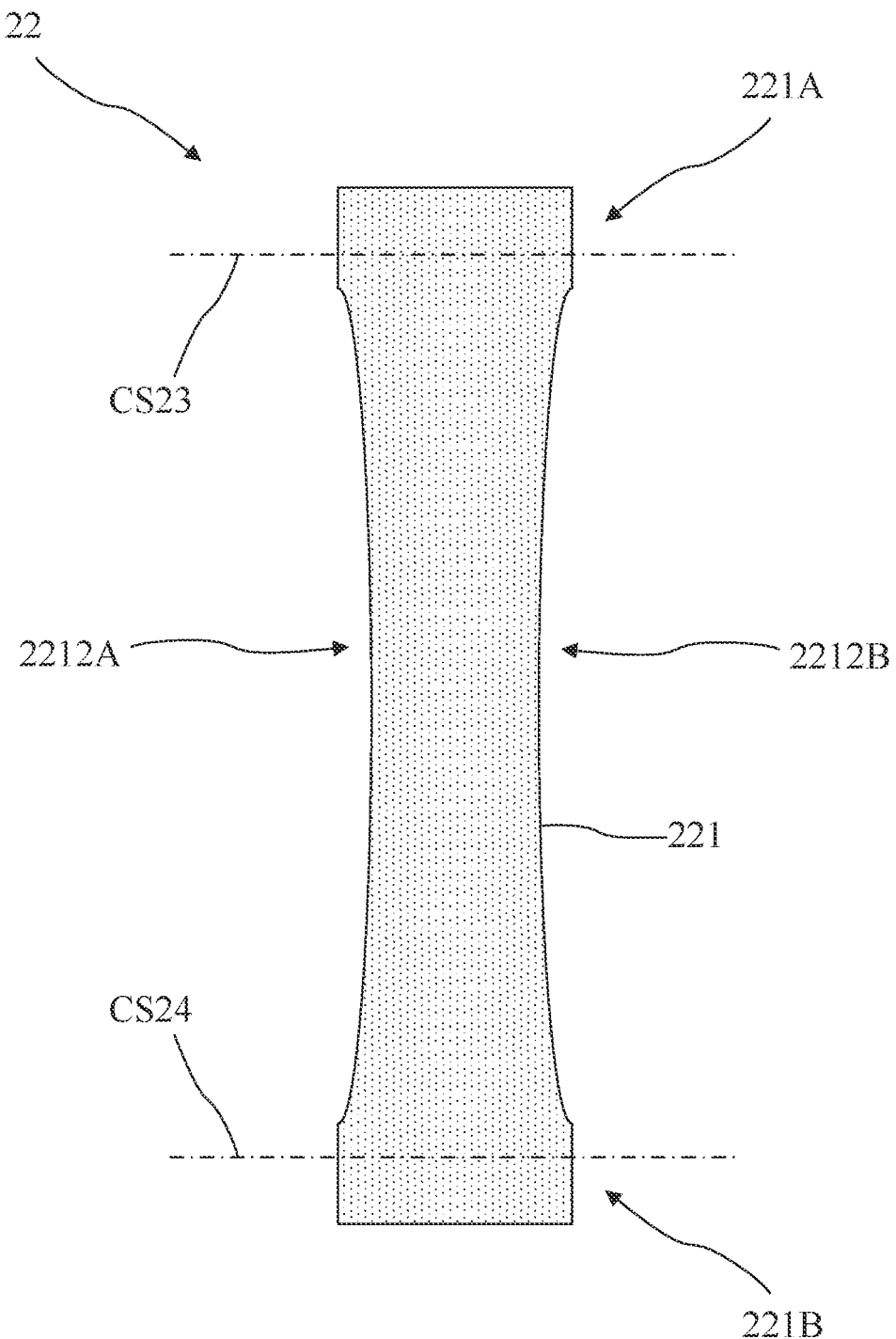
FIG. 2B is a front view of a probe structure according to some embodiments of the disclosure.

Referring to FIG. 2B, there is shown a front view of a probe structure 22 according to some embodiments of the disclosure. The probe structure 22 comprises a body 221. The body 221 has a first end 221A and a second end 221B. A first concave portion 2212A and a second concave portion 2212B are formed on the body 221 and extend from the first end 121A to the second end 121B. In some embodiments, the first concave portion 2212A and the second concave portion 2212B shown in the front views each look like a curve, and the two curves are symmetrically defined on the body 221.

In some embodiments, the first end 221A has a cross-sectional area on a first cross section CS23, and the second end 221B has a cross-sectional area on a second cross section CS24. The cross-sectional area of the first end 221A on the first cross section CS23 is the same as the cross-sectional area of the second end 221B on the second cross section CS24. The first cross section CS23 is parallel to the second cross section CS24. In some embodiments, the first end 221A and the second end 221B are of the same shape.

Figure 2C:
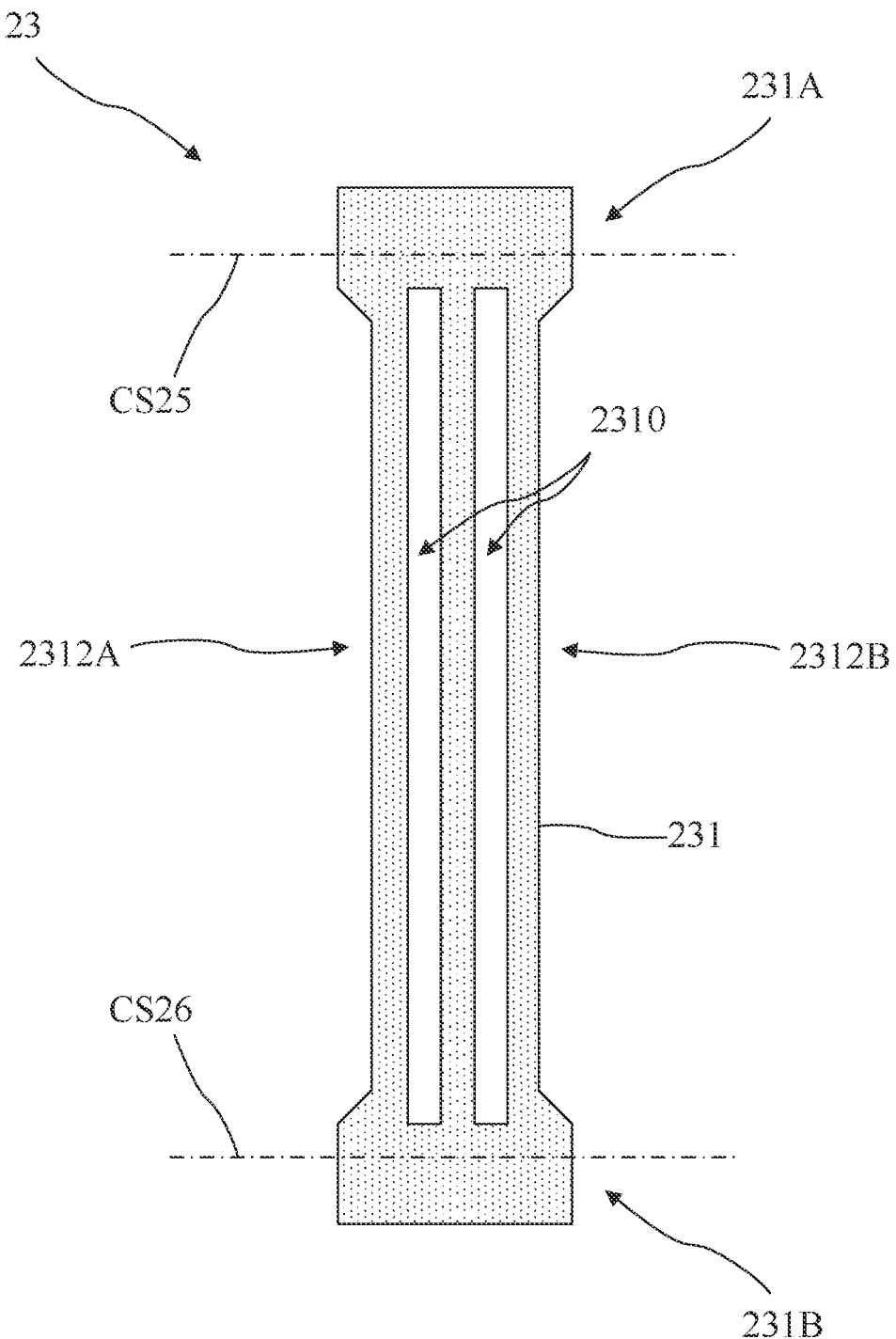
FIG. 2C is a front view of a probe structure according to some embodiments of the disclosure.

Referring to FIG. 2C, there is shown a front view of a probe structure 23 according to some embodiments of the disclosure. The probe structure 23 comprises a body 231. The body 231 has a first end 231A and a second end 231B. A plurality of hollowed-out portions 2310, a first concave portion 2312A and a second concave portion 2312B are formed on the body 231 and each extend from the first end 231A to the second end 231B. In some embodiments, the first concave portion 2312A and the second concave portion 2312B shown in the front views each look like a trapezoid, and the trapezoids are symmetrically defined on the body 231.

In some embodiments, the first end 231A has a cross-sectional area on a first cross section CS25, and the second end 231B has a cross-sectional area on a second cross section CS26. The cross-sectional area of the first end 231A on the first cross section CS25 is the same as the cross-sectional area of the second end 231B on the second cross section CS26. The first cross section CS25 is parallel to the second cross section CS26. In some embodiments, the first end 231A and the second end 231B are of the same shape.

The aforesaid concave and hollowed-out styles are not restrictive of the concave portions of the disclosure. All concave and hollowed-out shapes conducive to achieving the same benefits as disclosed in this disclosure are deemed falling into the scope of the disclosure.

Figure 3A:
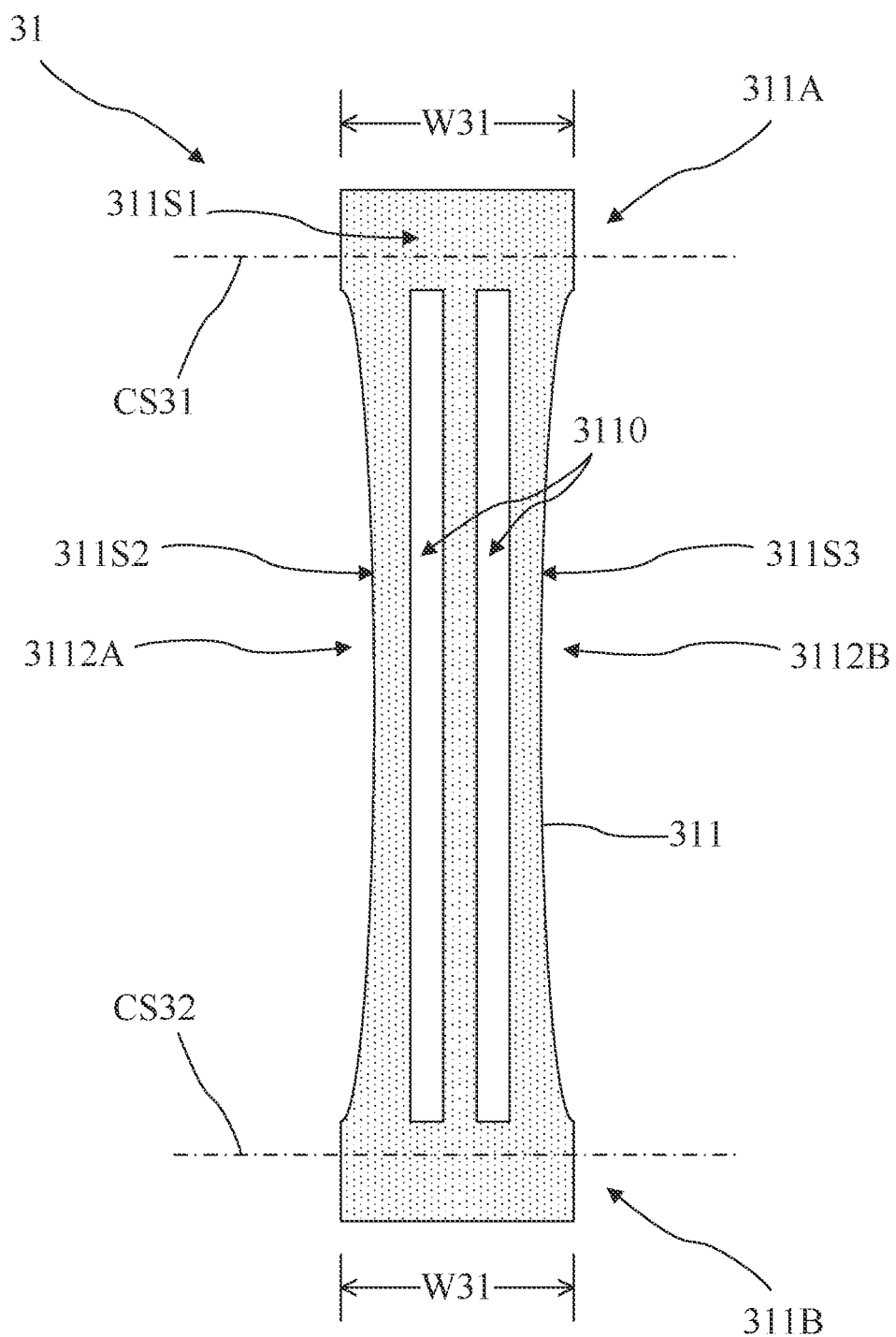
FIG. 3A is a front view of a probe structure according to some embodiments of the disclosure.

Referring to FIG. 3A, there is shown a front view of a probe structure 31 according to some embodiments of the disclosure. The probe structure 31 comprises a body 311. The body 311 has a first end 311A and a second end 311B. When viewed from the front-view surface shown in FIG. 3A, the first end 311A and the second end 311B are of the same width W31, whereas the body 311 has a first surface 311S1 on which a plurality of hollowed-out portions 3110 are formed to penetrate the body 311. The body 311 has at least a lateral surface 311S2, 311S3 which adjoins the first surface 311S1. The body 311 has a first concave portion 3112A and a second concave portion 3112B on the lateral surfaces 311S2, 311S3, respectively. In these embodiments, the hollowed-out portions 3110, the first concave portion 3112A and the second concave portion 3112B each extend from the first end 311A to the second end 311B.

In some embodiments, the first end 311A has a cross-sectional area on a first cross section CS31, and the second end 311B has a cross-sectional area on a second cross section CS32. The cross-sectional area of the first end 311A on the first cross section CS31 is the same as the cross-sectional area of the second end 311B on the second cross section CS32. The first cross section CS31 is parallel to the second cross section CS32. In some embodiments, the first end 311A and the second end 311B are of the same shape.

Figure 3B:
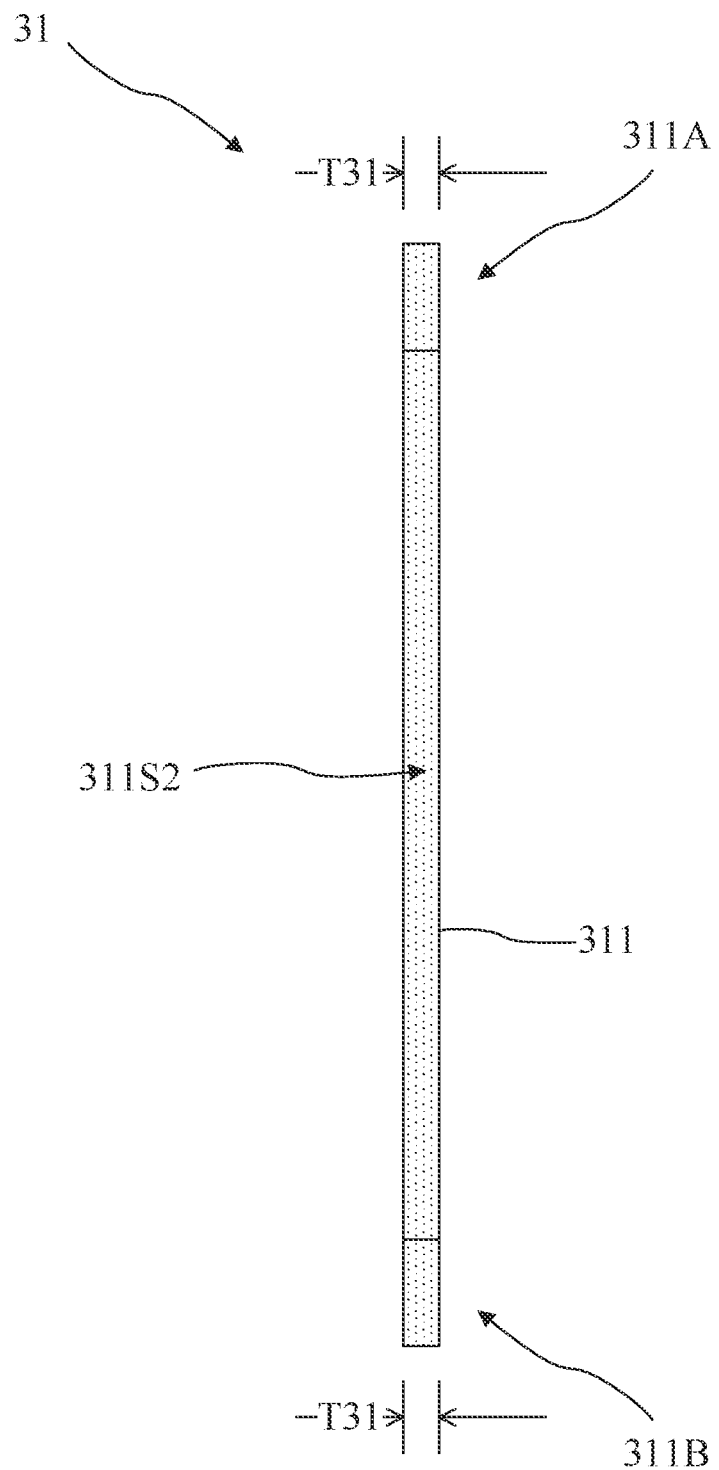
FIG. 3B is a side view of the probe structure according to some embodiments of the disclosure.

Referring to FIG. 3B, there is shown a side view of the probe structure 31 according to some embodiments of the disclosure. The side view in FIG. 3B starts from the lateral surface 311S2 corresponding in position to the first concave portion 3112A and shows that the body 311 is of the same thickness T31 from the first end 311A to the second end 311B. Thus, the lateral surface S311S2 of the body 311 is of the same width from the first end 311A to the second end 311B. In these embodiments, width W31 of the body 311 is greater than thickness T31 of the body 311.

Figure 3C:
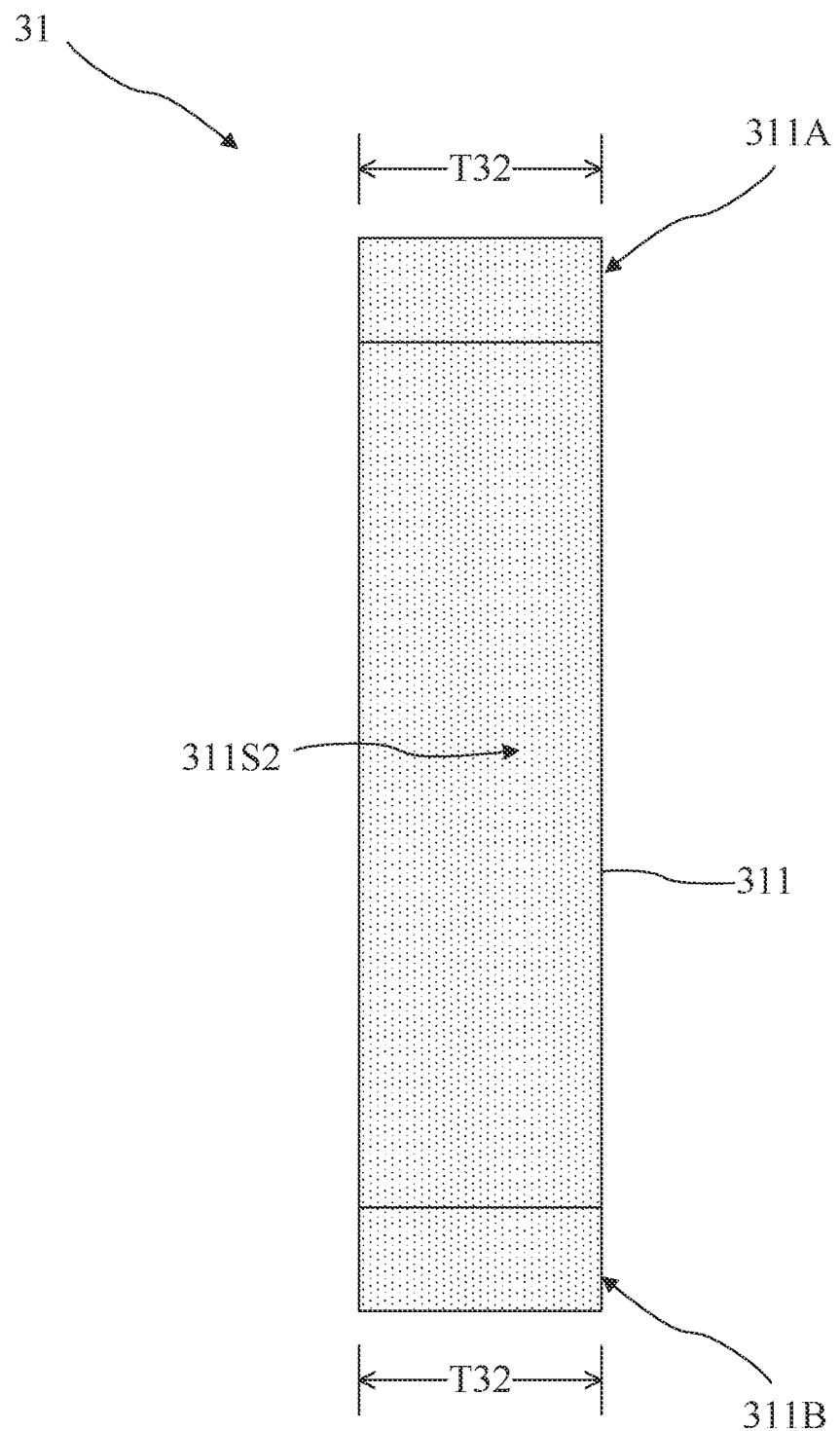
FIG. 3C is a side view of the probe structure according to some embodiments of the disclosure.

Referring to FIG. 3C, there is shown another side view of the probe structure 31 according to some embodiments of the disclosure. The side view in FIG. 3C starts from the lateral surface 311S2 corresponding in position to the first concave portion 3112A and shows that the body 311 is of the same thickness T32 from the first end 311A to the second end 311B. Thus, the lateral surface S311S2 of the body 311 is of the same width from the first end 311A to the second end 311B. In these embodiments, width W31 of the body 311 is equal to thickness T31 of the body 311.

Figure 4:
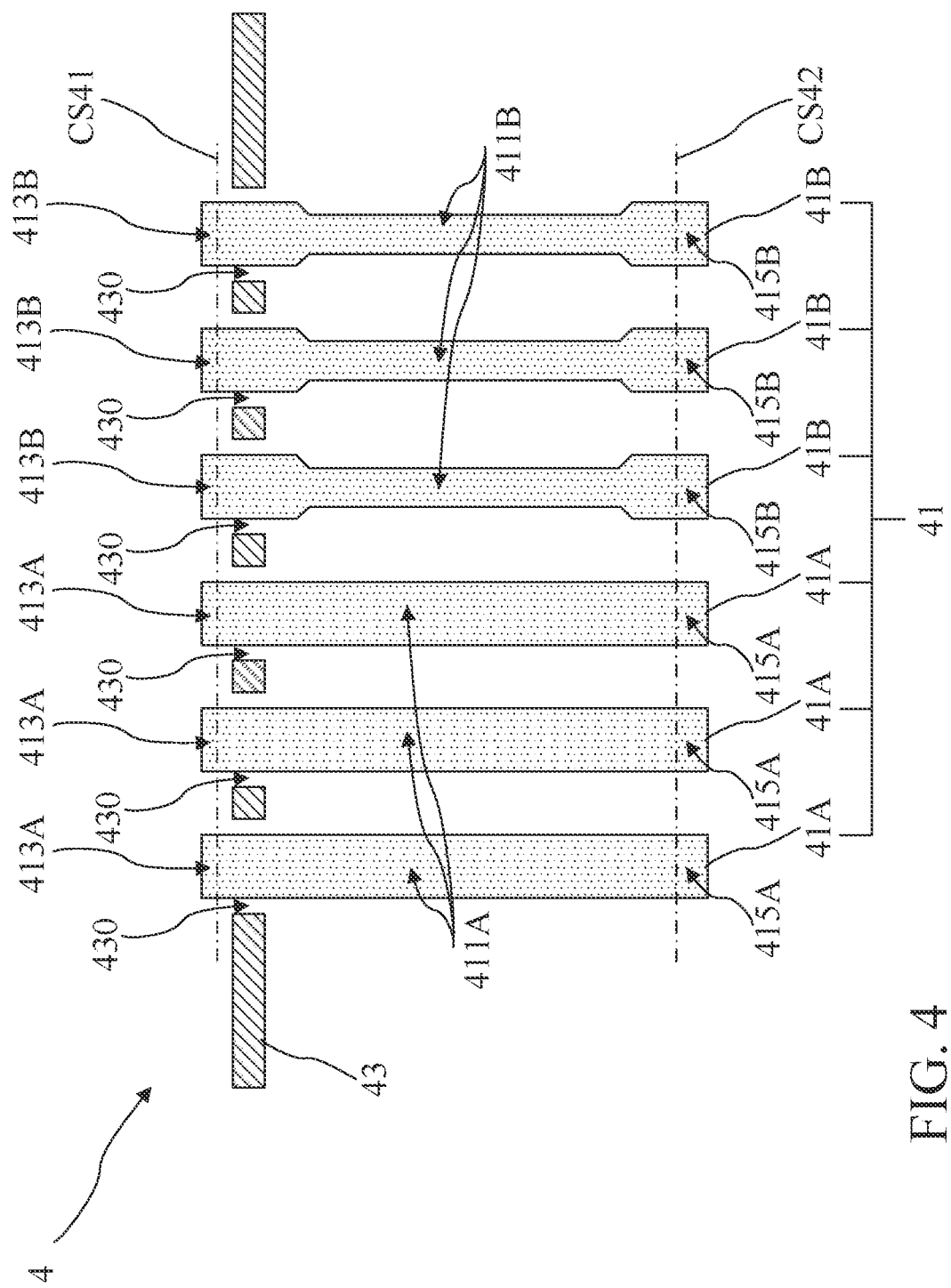
FIG. 4 is a schematic view of a probe array according to some embodiments of the disclosure.

Referring to FIG. 4, there is shown a schematic view of a probe array 4 according to some embodiments of the disclosure. The probe array 4 has a plurality of probe structures 41 and a guide plate 43. The guide plate 43 has a plurality of holes 430 for receiving one end of the probe structures 41. In some embodiments, the probe structures 41 each comprise at least a probe structure 41A and at least a probe structure 41B. Each probe structure 41A comprises a first body 411A. Each first body 411A has a first end 413A and a second end 415A. Each probe structure 41B comprises a first body 411B. Each first body 411B has a first end 413B and a second end 415B. The first end 413A of the first body 411A and the first end 413B of the first body 411B are located on the same side of the probe array 4.

In some embodiments, the first end 413A of the first body 411A and the first end 413B of the second body 411B have the same cross-sectional area on a first cross section CS41, whereas the second end 415A of the first body 411A and the second end 415B of the second body 411B have the same cross-sectional area on a second cross section CS42. The first cross section CS41 is parallel to the second cross section CS42.

In some embodiments, the first body 411A of the probe structure 41A is different from the second body 411B of the probe structure 41B in shape (for example, the first body 411A is of a shape, but the second body 411B is of another shape.) In some embodiments, the probe structure 41 includes but is not limited to the probe structures 11, 12, 13, 21, 22, 23, 31 or any combination thereof of the aforesaid embodiments.

Figure 5:
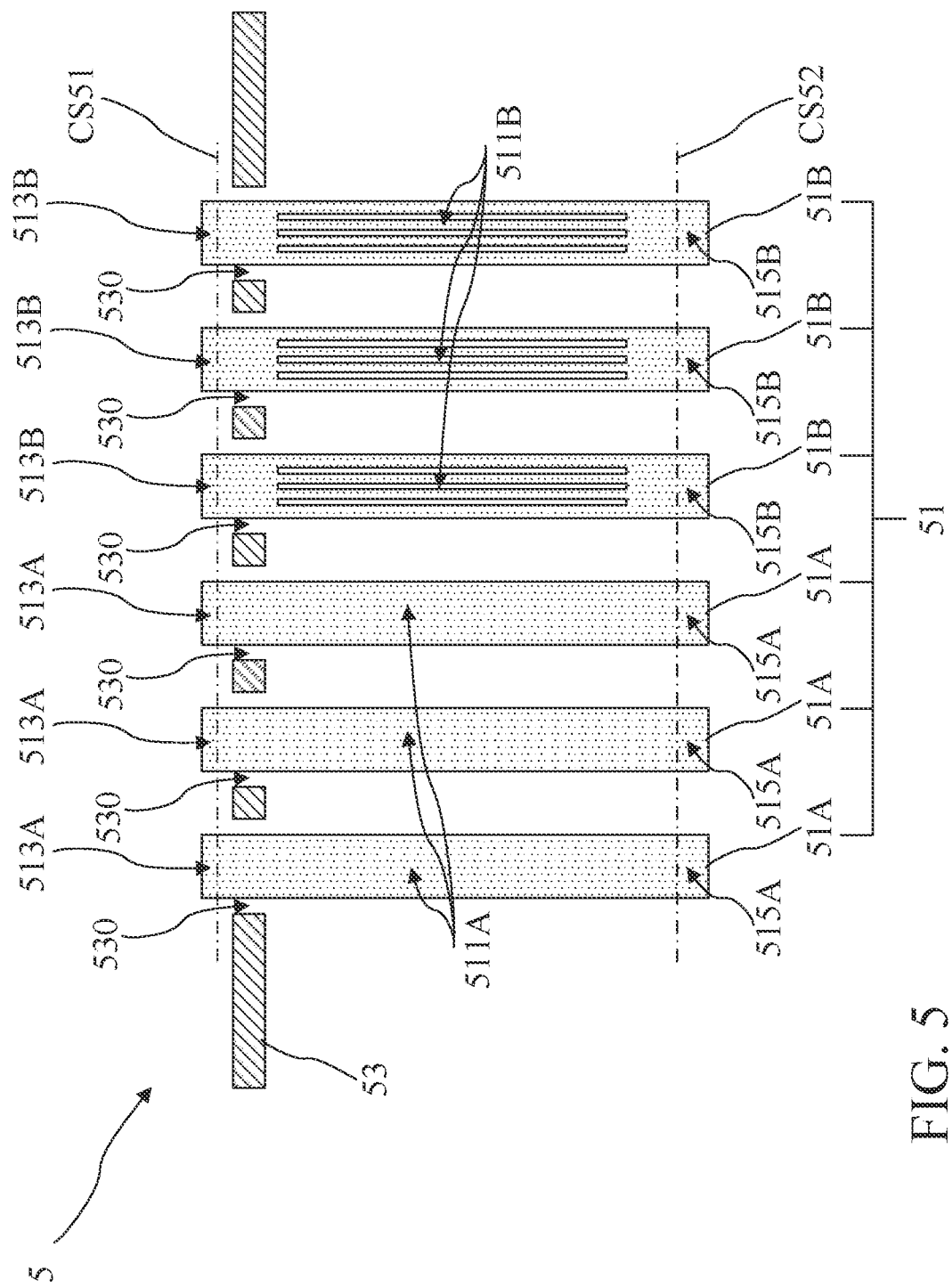
FIG. 5 is a schematic view of a probe array according to some embodiments of the disclosure.

Referring to FIG. 5, there is shown a schematic view of a probe array 5 according to some embodiments of the disclosure. The probe array 5 has a plurality of probe structures 51 and a guide plate 53. The guide plate 53 has a plurality of holes 530 for receiving one end of the probe structures 51. In some embodiments, each probe structure 51 comprises at least a probe structure 51A and at least a probe structure 51B. Each probe structure 51A comprises a first body 511A. Each first body 511A has a first end 513A and a second end 515A. Each probe structure 51B comprises a first body 511B. Each first body 511B has a first end 513B and a second end 515B. The first end 513A of the first body 511A and the first end 513B of the first body 511B are located on the same side of the probe array 5.

In some embodiments, the first end 513A of the first body 511A and the first end 513B of the second body 511B have the same cross-sectional area on a first cross section CS51, whereas the second end 515A of the first body 511A and the second end 515B of the second body 511B have the same cross-sectional area on a second cross section CS52. In some embodiments, the cross-sectional area of the first end 513A of the first body MA on the first cross section CS51 is the same as the cross-sectional area of the second end 515A of the first body 511A on the second cross section CS52, whereas the cross-sectional area of the first end 513B of the second body 511B on the first cross section CS51 is the same as the cross-sectional area of the second end 515B of the second body 511B on the second cross section CS52. The first cross section CS51 is parallel to the second cross section CS52.

In some embodiments, the first end 513A of the first body 511A, the second end 515A of the first body 511A, the first end 513B of the second body 511B, and the second end 515B of the second body 511B are of the same shape, and a plurality of holes 530 of the guide plate 53 are of the same size and shape. Thus, the plurality of holes 530 receive the first end 513A of the first body 511A and the first end 513B of the second body 511B simultaneously.

In some embodiments, the first body 511A of the probe structure 51A is different from the second body 511B of the probe structure 51B in shape (for example, first body 511A is of a shape, but the second body 511B is of another shape.) In some embodiments, the probe structure 51 includes the probe structures 11, 12, 13, 21, 22, 23, 31 or any combination thereof of the aforesaid embodiments without placing limitations on the probe array 5 and the probe structure 51.

According to the disclosure, probe structures of different sizes and shapes are arranged in the same probe array to fulfill different testing purposes. Furthermore, according to the disclosure, end portions of probe structures of the probe array are of the same shape, whereas openings of guide plates of the probe structures of the probe array are of the same dimensions. Therefore, the disclosure at least achieves advantages as follows: (1) easy to keep contact forces in equilibrium while the probe structures in the probe array are in contact with an object under test, thereby ensuring testing stability; (2) easy to adjust the intervals between the probe structures in the probe array; and (3) easy to control temperature in the course of testing while the probe structures in the probe array are in contact with an object under test, because of consistent contact surfaces.

Although the disclosure and advantages thereof are described above, persons skilled in the art understand that various changes, replacements and substitutions may be made to the disclosure without departing from the spirit and scope defined in the appended claims of the disclosure. For instance, the aforesaid processes may be implemented with different methods and replaced with any other processes or a combination thereof.

The scope of the disclosure is not restricted to specific embodiments of any processes, machines, manufacturing, matter compositions, means, methods and steps described herein. The disclosure described herein enables persons skilled in the art to implement the disclosure with any existing or potential processes, machines, manufacturing, matter compositions, means, methods or steps having the same function or capable of achieving substantially the same result as disclosed in the aforesaid embodiments. Therefore, these processes, machines, manufacturing, matter compositions, means, methods and steps fall within the scope of the appended claims of the disclosure.

What is claimed is:

1. A probe array, comprising:
   a first probe structure comprising:
   a first body having a first end and a second end; and
   a second probe structure comprising:
   a second body having a first end and a second end;
   wherein the first end of the first body and the first end of the second body have the same cross-sectional area on a first cross section, wherein the second end of the first body and the second end of the second body have the same cross-sectional area on a second cross section, with the first body being different from the second body in shape,
   wherein the at least a first concave portion is formed on the first body and extended from the first end of the first probe structure to the second end of the first probe structure, and
   wherein a first cross-sectional area of the first end of the first probe is greater than a second cross-sectional area of the first body with the at least a first concave portion, and a third cross-sectional area of the second end of the first probe is greater than the second cross-sectional area of the first body with the at least a first concave portion.

2. The probe array of claim 1, wherein the first end of the first body and the first end of the second body are located on the same side.

3. The probe array of claim 1, wherein the first cross section and the second cross section are parallel.

4. The probe array of claim 1, wherein the first end of the first body and the first end of the second body are of the same shape.

5. The probe array of claim 4, wherein the second end of the first body and the second end of the second body are of the same shape.

6. The probe array of claim 1, wherein the second end of the first body and the second end of the second body are of the same shape.

7. The probe array of claim 1, wherein at least a first hollowed-out portion is formed on the first body and extend from the first end of the first probe structure to the second end of the first probe structure.

8. The probe array of claim 7, wherein at least a second hollowed-out portion, at least a second concave portion, or a combination of the at least a second hollowed-out portion and the at least a second concave portion are formed on the second body and extend from the first end of the second probe structure to the second end of the second probe structure.

9. The probe array of claim 1, further comprising:
a guide plate having:
a first hole for receiving the first end of the first body; and
a second hole for receiving the first end of the second body.

10. The probe array of claim 9, wherein the first hole and the second hole are of the same size and shape.

11. A probe structure comprising:
a body having a first end and a second end, wherein at least a hollowed-portion, and at least a concave portion are formed on the body and extend from first end to the second end,
whrerin a cross-sectional area of the first end on a first cross-section is the same as a cross-sectional area of the second end on a second cross-section, wherein the first cross section and the second cross-section are parallel and
wherein the at least a concave portion is formed on the body and extended from the first end to the second end, wherein a first cross-sectional area of the first end is greater than a second cross-sectional area of the body with the at least a concave portion, and a third cross-sectional area of the second end is greater than the second cross-sectional area of the body with the at least a concave portion.

12. The probe structure of claim 11, wherein the first end and the second end are of the same shape.

13. The probe structure of claim 11, wherein the at least a concave portion has a curve or a trapezoid.

14. The probe structure of claim 11, wherein the body is of the same thickness from the first end to the second end.

* * * * *